(12) United States Patent
Fukunaga et al.

(10) Patent No.: US 6,185,717 B1
(45) Date of Patent: Feb. 6, 2001

(54) DATA RECEPTION UNIT

(75) Inventors: Shigeru Fukunaga; Yasuko Matsumura; Toshihisa Nakai, all of Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/173,548

(22) Filed: Oct. 16, 1998

(30) Foreign Application Priority Data

Oct. 17, 1997 (JP) .................................................... 9-285635

(51) Int. Cl.[7] .................................................... H03M 13/00
(52) U.S. Cl. ........................ 714/777; 714/775; 370/503; 360/72.2
(58) Field of Search .................................... 714/777, 775, 714/776, 778; 375/308, 329; 360/72.2, 40.9; 370/324, 503, 509–514

(56) References Cited

U.S. PATENT DOCUMENTS

| 4,914,535 | * | 3/1990 | Weng .................................. 360/72.2 |
| 5,289,476 | * | 2/1994 | Johnson et al. ....................... 714/775 |
| 5,944,842 | * | 8/1999 | Propp et al. .......................... 714/701 |
| 6,003,153 | * | 12/1999 | Shimoda ............................... 714/792 |

OTHER PUBLICATIONS

ITU–T Telecommunication Standardization Sector of ITU Draft H.263 (Dec. 5, 1995). Video Coding for Low Bitrate Communication. pp. 1–43.

* cited by examiner

*Primary Examiner*—Emmanuel L. Moise
(74) *Attorney, Agent, or Firm*—Rabin & Champagne, P.C.

(57) ABSTRACT

A data reception unit having improved robustness against synchronization code errors. In data transmission, the synchronization code is always located in the headers of coded data contained in the package payload. Where the number of synchronization code bit errors falls below a threshold value, decoding is performed ignoring the errors. Where the number of bit errors exceeds the threshold value, the encoded data in the packet is discarded. Robustness against errors are modified through manipulation of the threshold value in response to transmission path type and error status.

17 Claims, 4 Drawing Sheets

DATA RECEPTION UNIT

BACKGROUND OF THE INVENTION

1. Field of the Invention

This invention relates to a data reception unit for use in a communication system such as a video communication system. In particular, the invention relates to a data reception unit having the ability to prevent deterioration in image quality resulting from data errors, drop outs, and other problems occurring during transmission.

2. Description of the Related Art

Communication systems known in the prior art include motion video transmission systems. Motion video systems include video telephony systems, video conferencing systems, and video on demand (VOD) systems. The task of developing international standards for motion video encoding is ongoing with the goal of developing systems for transmitting motion video. Representative international standards include ITU-T H.261 and H.263, as well as the ISO's international standards MPEG (Moving Pictures Experts Group) phases 1, 2, and 4.

Coded data comprises a series of codewords (hereinafter referred to as "bit stream"). For transmission, the bit stream is not transmitted as-is but is rather broken up into shorter data sequences. Specifically, the serial bit stream is broken up into data units (hereinafter termed "packets") of finite length for transmission. Each packet has a header and a payload; the header contains control information and the payload contains a coded data unit.

Data errors occurring during transmission of encoded motion video prevent the receiving unit from correctly decoding the coded data. Particularly where variable length encoding has been used, such errors not only prevent the particular codeword from being decoded, but also prevent correct decoding of other codewords coming after the codeword in question. Variable length encoding is widely employed in the international standards.

In motion video transmission systems employing variable length encoding, it is common practice to periodically insert synchronization codes into the coded data. Synchronization codes consist of unique bit sequences of a type certain not to appear in the encoded motion video data. In the event of a codeword error in received data, the decoder is able to resynchronize through detection of the synchronization code. Resynchronization allows the decoder to correctly decode subsequent codewords.

In ITU-T H.263, coded data frames each consist of a block that starts with a Picture Start Code (PSC), as well as a Group of Blocks (GOB). A PSC is inserted into the header for each frame. GOB refers to the blocks of the frame, and consists of a plurality of a macroblock (MB) lines. The MB is the unit for encoding. The header of macroblock contains a Group of Block Start Code (GBSC) that functions as a synchronization code.

The PSC has fixed word length and is represented by the 22 bit sequence "0000 0000 0000 0000 1 00000". The GBS also has fixed word length and is represented by the 17 bit sequence "0000 0000 0000 0000 1". The leading 17 bits of each of the two types of synchronization code have the same value. Accordingly, the leading 17 bits of the PSC and the leading 17 bits of the GBS can be viewed as a single synchronization code.

Even a single bit error will render the synchronization code undetectable. Accordingly, the synchronization code is not robust against transmission errors occurring with long codewords.

SUMMARY OF THE INVENTION

It is an object of the present invention to improve the robustness of data reception units against synchronization code transmission errors. Specifically, it is an object of this invention to provide a data reception unit that reliably affords adequate robustness against errors, even where a long-bit length synchronization code is used.

It is a further object of the present invention to provide a data reception unit wherein the robustness of the synchronization code against errors can be modified in accordance with the service conditions of the communication system.

This object is achieved in the data reception unit which pertains to this invention through the provision of reception means for acquiring coded data from packets received from the outside, synchronization code extraction means for extracting leading n-bit data (where n is a natural number) from the coded data acquired by the comprising reception means, Hamming distance computing means for computing the Hamming distance between the leading n-bit data and the synchronization code, synchronization code decision means for deciding whether the leading n-bit data is the synchronization code by comparing the Hamming distance with a threshold value, and decoding means for performing decoding of coded data where the synchronization code decision means has designated the leading n-bit data as the synchronization code.

In data transmission conducted using the present invention, the synchronization code is always located in the header of coded data contained in the payload of each packet. The data reception unit which pertains to this invention detects synchronization code bit errors, and where the number of bit errors falls below a certain threshold value, decoding is performed ignoring the errors. The robustness of the data reception unit against errors can be modified through manipulation of this threshold value.

BRIEF DESCRIPTION OF THE DRAWINGS

Other objects and advantages of the invention will become apparent through the following discussion referring to the accompanying drawings.

DESCRIPTION OF THE PREFERRED EMBODIMENTS

Embodiment 1

The data reception unit pertaining to Embodiment 1 will now be described referring to the accompanying drawings.

A characterizing feature of the data reception unit pertaining to Embodiment 1 is that, even where there are errors in the synchronization code, the synchronization code can be determined provided that the number of error bits falls below a predetermined threshold value.

In the transmission system pertaining to this embodiment, the data transmission unit transmits code units prefaced with a synchronization code of fixed word length n, transmitted in the payload of each packet. In other words, in the transmission system pertaining to this embodiment, the synchronization code always comprises the lead n bits of the code unit contained in the packet payload. A single type of synchronization code is used in data transmission.

Figure 1:
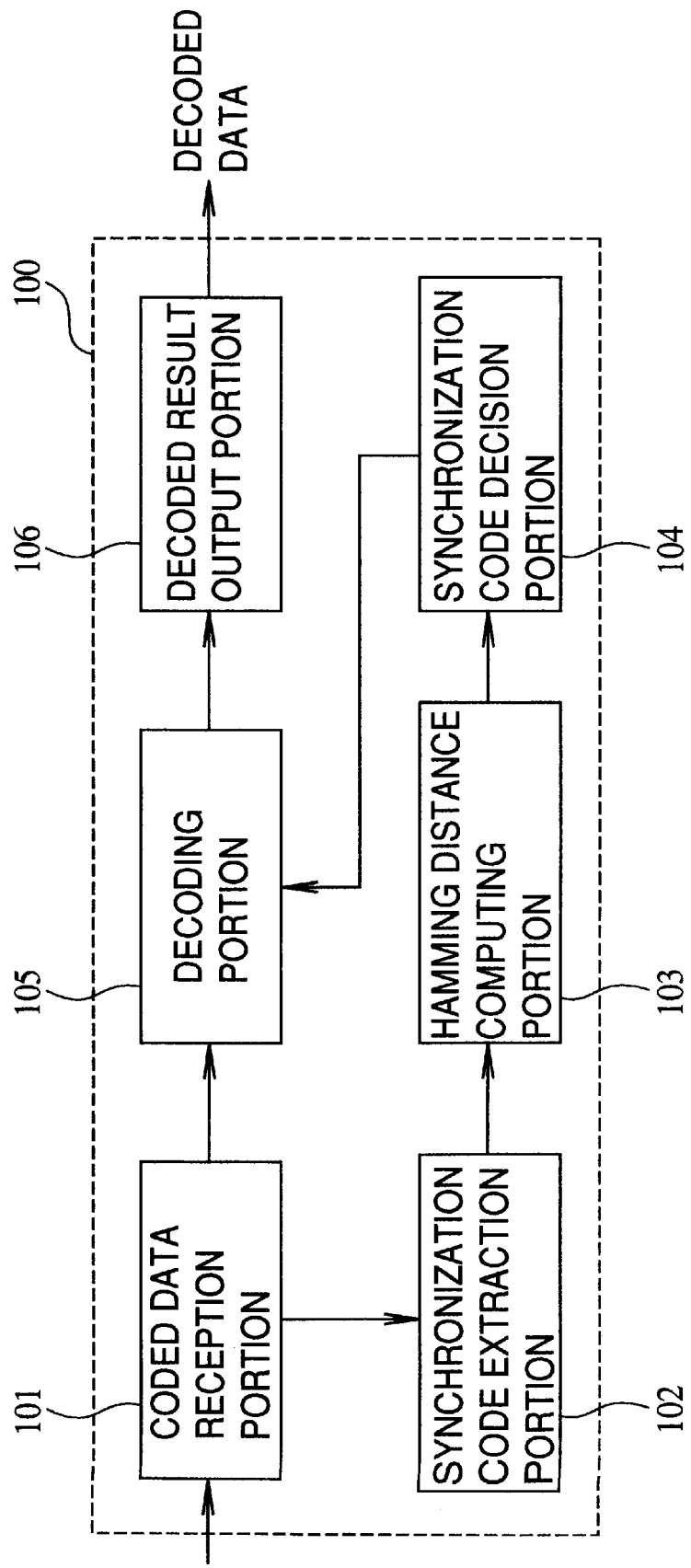
FIG. 1 is a block diagram depicting functional design in the data reception unit pertaining to Embodiment 1 of the invention.

FIG. 1 is a block diagram depicting functional design in the data reception unit pertaining to Embodiment 1 of the invention.

Referring to FIG. 1, the data reception unit 100 comprises a coded data reception portion 101, a synchronization code extraction portion 102, a Hamming distance computing portion 103, a synchronization code decision portion 104, a decoding portion 105, and a decoded result output portion 106.

The coded data reception portion 101 receives packets from the data transmission unit. It then acquires the coded data contained in the payload of each packet. The coded data is delivered in the form of a single code unit to the synchronization code extraction portion 102 and the decoding portion 105.

The synchronization code extraction portion 102 receives the coded data sent by the reception portion 101 in the form of a single code unit. It then extracts the leading n bits (where n is the code length of the synchronization code) from the received coded data. This n-bit data is then delivered to the Hamming distance computing portion 103.

The Hamming distance computing portion 103 contains stored bit data representing the synchronization code. The computing portion 103 compares the n-bit data received from the code extraction portion 102 with this stored bit data and computes the number of bits that do not match (i.e., the Hamming distance). The Hamming distance so computed is sent by the computing portion 103 to the synchronization code decision portion 104.

The synchronization code decision portion 104 compares the Hamming distance received from the computing portion 103 with a threshold value m stored therein. If the Hamming distance is equal to or less than the threshold value m, the n-bit data that has been extracted by the extraction portion 102 is decided to be the synchronization code. Conversely, where the Hamming distance is greater than the threshold value m, the decision is made that the n-bit data is not the synchronization code. The threshold value m can be user-modified in response to conditions in the transmission system, with the proviso that the threshold value m fulfill the condition $0 \leq m \leq n$. The result of the synchronization code decision is sent in the form of a decision signal to the decoding portion 105.

The decoding portion 105 receives the decision signal from the decision portion 104. Depending on the value of the decision signal, the decoding process described below is performed.

The decoded result output portion 106 receives the decoded data from the decoding portion 105 and outputs it from the unit.

Figure 2:
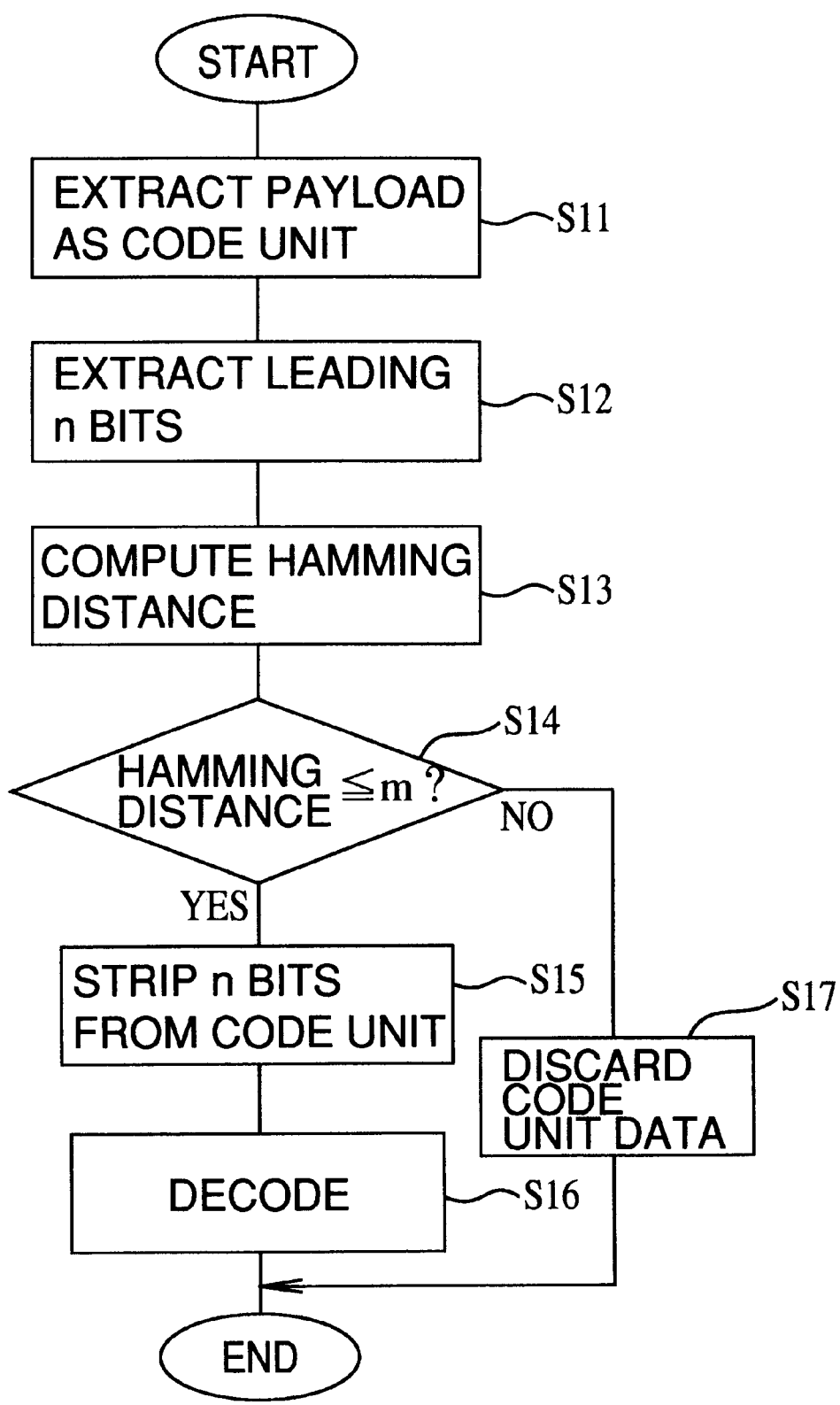
FIG. 2 is a flow chart depicting operation of the data reception unit pertaining to Embodiment 1 of the invention.

The overall operation of the data reception unit depicted in FIG. 1 will now be described referring to the flowchart in FIG. 2.

First, the reception portion 101 extracts the coded data from the payload of each packet received from the data transmission unit (S11).

The extraction portion 102 then extracts the leading n-bit data from the coded data (S12).

The computing portion 103 then computes the Hamming distance between the n-bit data and the synchronization code (S13).

The decision portion 104 compares the ramming distance with the threshold value m. Where the Hamming distance is equal to or less than the threshold value m, the decision portion 104 makes the decision that the n-bit data is the synchronization code (S14). In this event, decoding is performed by the decoding portion 105 subsequent to step S14. The decoding process includes a step in which the synchronization code (the aforementioned n-bit data) is stripped from the coded data received from the reception portion 101 (S15) and a step in which the remaining data is decoded (S16).

Where it is determined in step S14 that the Hamming distance is greater than the threshold value m, the decision portion 104 makes the decision that that the n-bit data is not the synchronization code. In this event the coded data from the packet containing this n-bit data is discarded without decoding (S17).

The entire bit stream can be decoded by repeating the procedure described above.

With this reception process, as long as no errors have occurred during data transmission, no errors will be produced in the synchronization codes contained in the payloads of received packets. Thus, in this case, the value of the leading n-bit data of the coded data extracted from the payload of each received packet will equal the value of the synchronization code (that is, the value of the n-bit data stored in the computing portion 103), and as a result the Hamming distance computed by the computing portion 103 will equal zero. The decoding portion 105 makes the decision that there are no errors in the coded data contained in the payloads of the received packets and performs the normal decoding operation.

Where errors have occurred during transmission, these errors may in some cases cause the value of the synchronization code to change. In data reception units of the prior art, even a single bit error in a synchronization code makes it impossible to decode the coded data coming between this synchronization code and the next synchronization code, making it necessary to discard all of this coded data.

In contrast, the design of the data reception unit 100 which pertains to this embodiment is such that the leading n-bit data is treated as the synchronization code as long as the Hamming distance is a value equal to or less than m, so that coded data coming after the synchronization code is decoded without discarding it as long as the number of errors in the synchronization code does not exceed m. In the case of transmission in accordance with ITU-T H.263, for example, setting the threshold value m to 3 allows bit data to be identified as a synchronization code even if the 17-bit synchronization code contains up to three bit errors. For example, where the leading 17-bit data is received as "0010 0100 1000 0000 1", the Hamming distance between this data and the synchronization code "0000 0000 0000 0000 1" is three bits, allowing it to be identified as the synchronization code.

One proposed data transmission technique involves further dividing up the packets into a plurality of segments for transmission. Where packets are transmitted in segment units, drop out of the lead segment for any reason results in placement in the code unit header of an n-bit data sequence that is not the synchronization code when the segments are subsequently assembled by the receiver to reconstitute the packets. The fact that the Hamming distance between leading n-bit data and the synchronization code usually exceeds the threshold value m means that in such an event the decision portion 104 will decide that the n-bit data in question is not the synchronization code. Accordingly, the data contained in the packet will be discarded without decoding by the decoding portion 105. Thus, erroneous decoding of packets coming after the packet with the dropped out lead segment can be avoided.

Even where an n-bit data sequence differs completely from the bit data corresponding to the synchronization code (the bit data stored in the computing portion 103), the data reception unit 100 which pertains to this embodiment will decide it to be the synchronization code if the Hamming distance is equal to m or less. Thus, depending on the codeword combination, it is possible that a bit string could be produced that could be misidentified as the synchronization code. The probability of this occurring is higher the higher the value for m. However, in this embodiment the synchronization code is always contained in the leading n bits of the payload of each packet, preventing this problem from occurring even where the Hamming distance for bit data contained on other portions of the payload is a value equal to or less than m.

Where packets have been divided into segments for transmission in the manner described above, drop out of the lead segment creates the possibility that the Hamming distance for the bit string of a second or subsequent segment may just happen to equal m or less, with the result that this bit string is misidentified as the synchronization code. However, the probability of such a chance occurrence is extremely low, and is not considered to pose a problem in actual practice. The probability of the synchronization code itself containing an error is much higher than the probability of such a chance occurrence. Thus, the practice of designing tolerance for errors of m bits or less to enhance robustness with respect to synchronization code errors is extremely effective in terms of the efficiency and reliability of encoding.

Where the transmission route does not involve dividing the packets into segments, the leading n bits of the data contained in the payload always constitute the synchronization code, as noted earlier. In this case, the value of the threshold value m may equal the value of n.

In the data reception unit which pertains to this embodiment, the threshold value m can be changed with reference to transmission path conditions and error status so as to provide optimum robustness against errors in the synchronization code.

In accordance with the data reception unit of the embodiment disclosed above, provided that the number of errors occurring in a synchronization code is equal to or less than m, the errors do not result in the coded data coming after the synchronization code being discarded, thus increasing the probability the synchronization can be reestablished.

In accordance with the data reception unit of the foregoing embodiment, robustness against synchronization code errors can be controlled easily through manipulation of the threshold value m.

Embodiment 2

The data reception unit pertaining to Embodiment 2 of this invention will now be described.

The data reception unit of this embodiment differs from Embodiment 1 in that it can handle data transmissions in which a plurality of types of synchronization code are defined.

In cases where a plurality of types of synchronization code are defined, the synchronization codes will have different codeword lengths. Accordingly, the data reception unit of this embodiment is designed to enable a different threshold value for Hamming distance to be set for each synchronization code.

Figure 3:
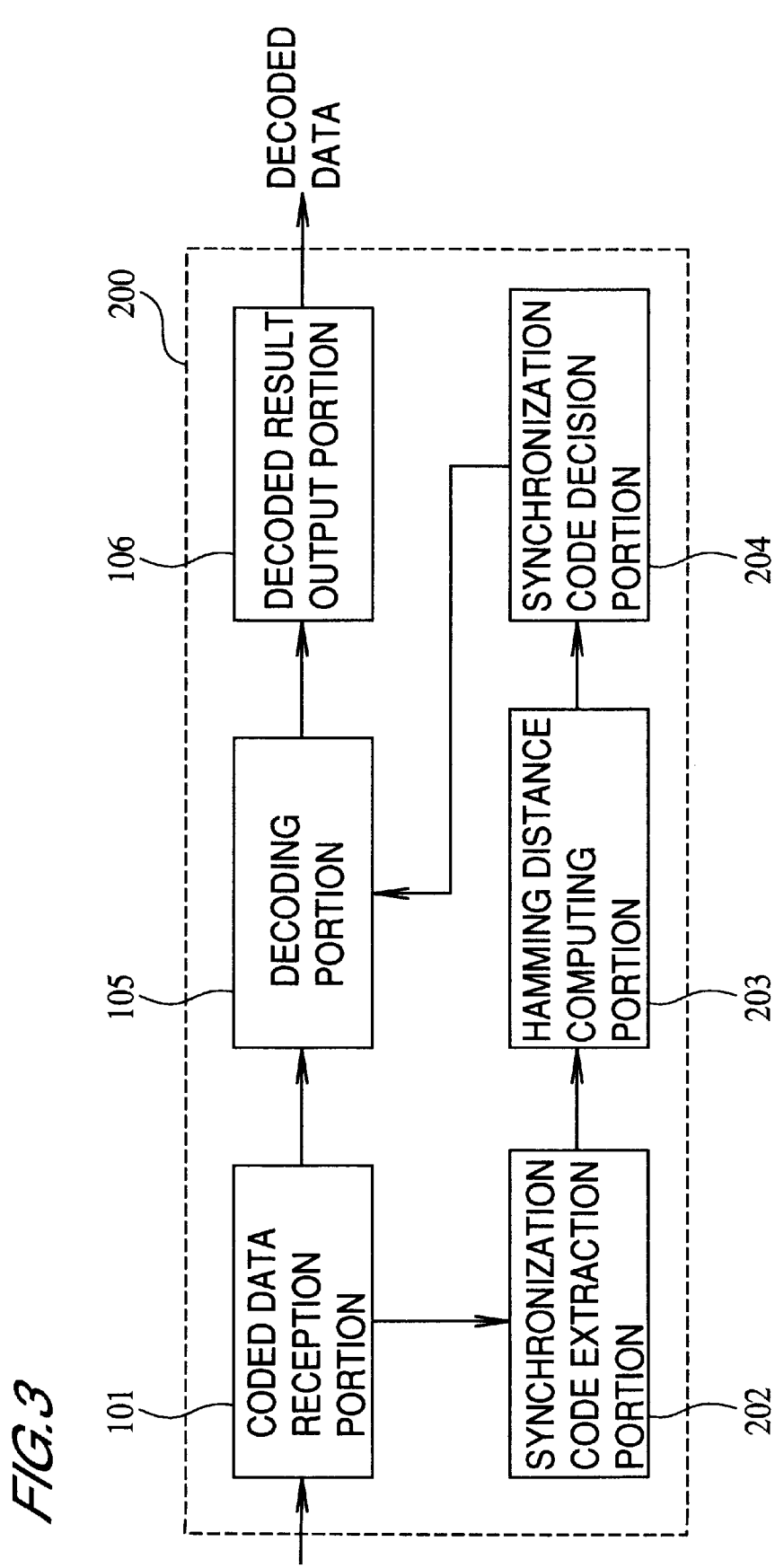
FIG. 3 is a block diagram depicting functional design in the data reception unit pertaining to Embodiment 2 of the invention.

FIG. 3 is a functional design diagram of the data reception unit 200 pertaining to this embodiment.

In FIG. 3, components assigned the same symbols as in FIG. 1 are constituted analogously to those in FIG. 1.

A synchronization code extraction portion 202 receives from a reception portion 101 coded data in code unit form. Bit strings comprising leading $n_1$ through $n_k$ bits (k is a natural number) are extracted from the received coded data. Each of the extracted k types of bit string is delivered to a Hamming distance computing portion 203.

The Hamming distance computing portion 203 contains stored bit data corresponding to each synchronization code. The computing portion 203 compares the k types of bit data sent from the extraction portion 202 to the bit data stored therein and computes the Hamming distances. Each of the k computed Hamming distances is sent from the computing portion 203 to a synchronization code decision portion 204.

The synchronization code decision portion 204 contains stored therein threshold values $m_1$ through $m_k$ corresponding to each of the synchronization codes. The decision portion 204 compares the Hamming distances received from the computing portion 203 to the corresponding threshold value. The synchronization code decision process described below is then conducted, and the results of the decision are sent to a decoding portion 105.

Figure 4:
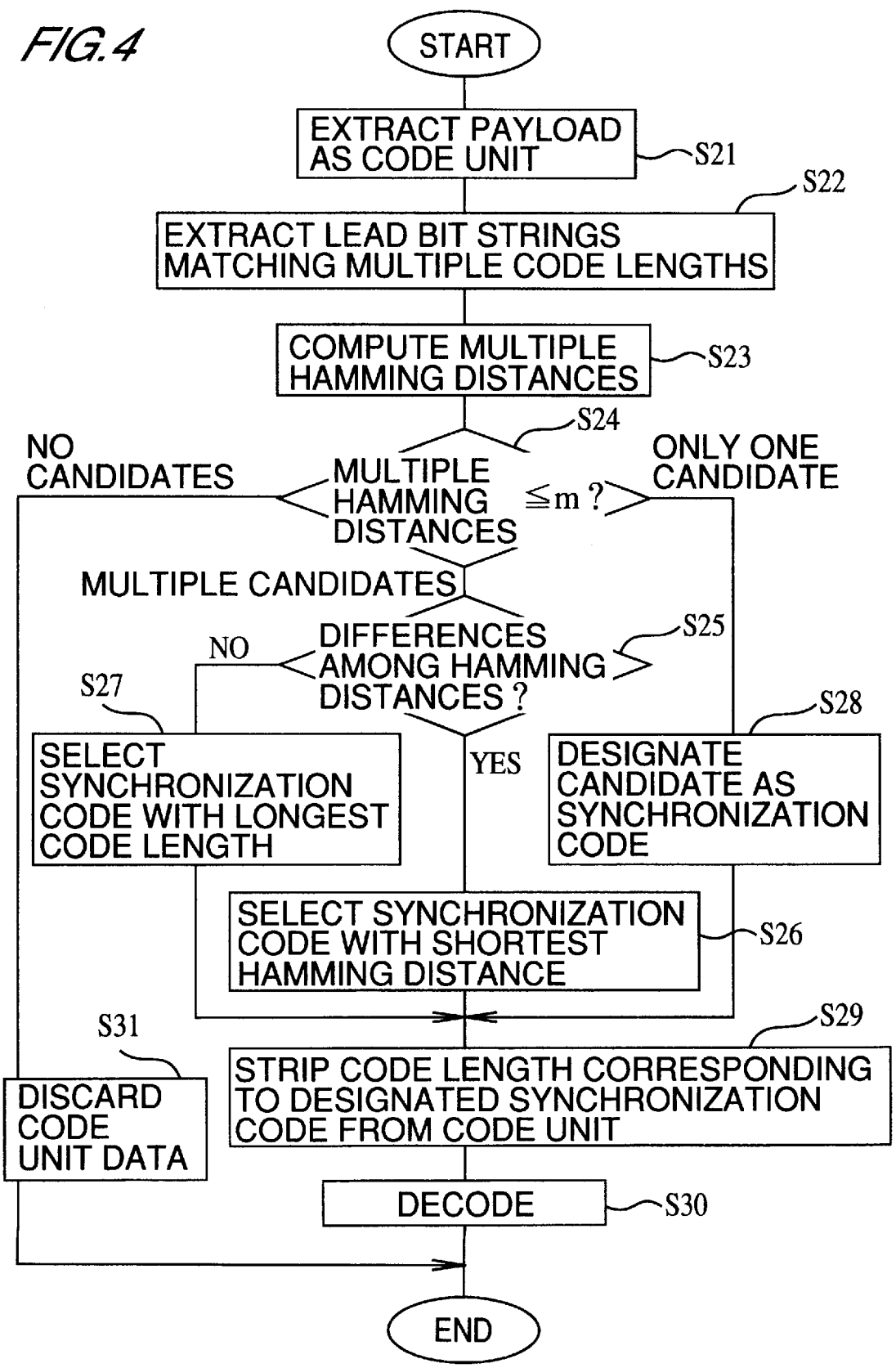
FIG. 4 is a flow chart depicting operation of the data reception unit pertaining to Embodiment 2 of the invention.

The overall operation of the data reception unit depicted in FIG. 3 will now be described referring to the flowchart in FIG. 4.

First, the reception portion 101 extracts coded data from the payload of each packet received from the data transmission unit (S21).

The extraction portion 202 then extracts k types of leading bit strings from the coded data (S22).

The computing portion 203 then computes Hamming distance between each of the k bit strings and the synchronization codes (S23).

The decision portion 204 then compares each Hamming distance with a threshold value (S24). Where a Hamming distance is equal to or less than the threshold value, the synchronization code with which this Hamming distance is associated is designated as a synchronization code candidate.

In the event that step S24 gives multiple synchronization code candidates, differences among Hamming distances associated with these synchronization code candidates are computed (S25). Where there are differences among the Hamming distances, the synchronization code candidate having the smallest associated Hamming distance is designated as the synchronization code (S26). On the other hand, where there are no differences among the Hamming distances, the synchronization code candidate having the longest codeword length is designated as the synchronization code (S27).

In the event that step S24 gives only one synchronization code candidate, this synchronization code candidate is designated as the synchronization code (S28).

Once the synchronization code has been designated, the decoding process is performed by the decoding portion 105. The decoding process includes a step in which the synchronization code is stripped from the coded data received from the reception portion 101 (S28) and a step in which the remaining data is decoded (S29).

Where step S24 does not yield a synchronization code candidate, the decoding portion 105 discards the coded data in the packet without decoding it (S31).

The entire bit stream can be decoded by repeating the procedure described above.

Where two or more types of synchronization code are employed but these synchronization codes will be received in a predetermined order, the data reception unit may employ a process analogous to that used for a single type of synchronization code, thereby obviating the need to use the embodiment described here. For example, where two types of synchronization code, such as a synchronization code located in the frame header (PSC, for example) and a synchronization code located in the group block header (GBSC, for example), and the number of group blocks is the same for each frame, it can be predicted with certainty which of the synchronization codes will be the next one to be received. In such cases, it is sufficient simply to decide the next synchronization code to be received in a process analogous to that described in Embodiment 1.

Elements of the data reception units of Embodiments 1 and 2 can be realized through hardware or through software.

The Embodiments have been illustrated using examples of motion video transmission, but the invention has potential application in transmission of other types of data, such as voice data or binary data.

In accordance with the present invention disclosed herein, there is now provided a data reception unit providing enhanced robustness against synchronization code errors.

Since the robustness against synchronization code errors can be readily adjusted through manipulation of the threshold value, robustness against errors can be modified with reference to the type of transmission path and error status.

What is claimed is:

1. A data reception unit, comprising:
    coded data reception means for acquiring coded data from packets received from the outside;
    synchronization code extraction means for extracting leading n-bit data (where n is a natural number) from coded data acquired by said coded data reception means;
    Hamming distance computing means containing stored therein bit data representing the synchronization code for computing the Hamming distance between said leading n-bit data and the stored data representing the synchronization code;
    synchronization code decision means for deciding whether said leading n-bit data is the synchronization code by comparing said Hamming distance with a threshold value; and
    decoding means for performing decoding of said coded data where said synchronization code decision means has designated said leading n-bit data as the synchronization code.

2. The data reception unit according to claim 1, wherein said extraction means extracts a single type of leading n-bit data.

3. The data reception unit according to claim 2, wherein said computing means contains stored therein a bit string of n bits corresponding to said synchronization code, and computes the Hamming distance between this bit string and said leading n-bit data.

4. The data reception unit according to claim 2, wherein said decision means designates said leading n-bit data as said synchronization code in the event that said Hamming distance is equal to or less than a threshold value, and does not designate said leading n-bit data as said synchronization code in the event that said Hamming distance is greater than a threshold value.

5. The data reception unit according to claim 2, wherein said decoding means performs said decoding operation on said coded data in the event that said leading n-bit data has been designated as the synchronization code, and discards said coded data in the event that said leading n-bit data has not been designated as the synchronization code.

6. The data reception unit according to claim 1, wherein said extracted leading n-bit data comprises k types of bit strings consisting of $n_1$ through $n_k$ bits.

7. The data reception unit according to claim 6, wherein said computing means contains stored therein k types of bit strings corresponding to said synchronization code, and computes Hamming distances between these stored k types of bit strings and the extracted k types of bit streams of the extracted leading n-bit data.

8. The data reception unit according to claim 6, wherein said decision means designates as a synchronization code candidate said leading n-bit data with a Hamming distance equal to or less than a threshold value, and in the event that there are multiple synchronization code candidates, designates one of the synchronization code candidates as the synchronization code, while in the event that there is no said synchronization code candidate, does not designate said leading n-bit data as said synchronization code.

9. The data reception unit according to claim 8, wherein said threshold value is established independently for each said synchronization code.

10. The data reception unit according to claim 9, wherein in the event that said multiple synchronization code candidates have different Hamming distances, said decision means designates said synchronization code candidate having the smallest Hamming distance as the synchronization code, and, in the event that said multiple synchronization code candidates have equal Hamming distances, designates said synchronization code candidate having the longest codeword as the synchronization code.

11. The data reception unit according to claim 6, wherein said decoding means performs said decoding on said coded data in the event that any of said leading n-bit data is designated as the synchronization code, and discards said coded data in the event that none of said leading n-bit data is designated as the synchronization code.

12. The data reception unit according to claim 1, wherein said extraction means extracts from said coded data said leading n-bit data through selection of a bit string having a bit count that corresponds to the next synchronization code to be received from among bit counts corresponding to multiple types of synchronization code used in data transmission.

13. The data reception unit according to claim 12, wherein said computing means contains stored therein bit strings corresponding to multiple types of synchronization code used in data transmission, and computes the Hamming distance between said leading n-bit data and the bit string selected from among these bit strings as having a bit count that corresponds to the next synchronization code.

14. The data reception unit according to claim 12, wherein in the event that said Hamming distance is equal to or less than a threshold value, said decision means designates said leading n-bit data as said synchronization code, and in the event that said Hamming distance is greater than the threshold value, does not designate said leading n-bit data as said synchronization code.

15. The data reception unit according to claim 12, wherein said decoding means performs said decoding on said coded data in the event of that said leading n-bit data is designated as the synchronization code, and discards said coded data in the event that said leading n-bit data is not designated as the synchronization code.

16. The data reception unit according to claim 12, wherein said multiple types of synchronization code are synchronization codes contained in frame headers and synchronization codes contained in each frame block.

17. The data reception unit according to claim 1, wherein said coded data includes encoded motion video data, voice data or binary data.

\* \* \* \* \*